(12) United States Patent
Wildhagen

(10) Patent No.: US 7,697,910 B2
(45) Date of Patent: Apr. 13, 2010

(54) METHOD FOR SEPARATING A RDS SIGNAL COMPONENT AND SIGNAL RECEIVER

(75) Inventor: Jens Wildhagen, Weinstadt (DE)

(73) Assignee: Sony Deutschland GmbH, Cologne (DE)

( * ) Notice: Subject to any disclaimer, the term of this patent is extended or adjusted under 35 U.S.C. 154(b) by 1218 days.

(21) Appl. No.: 10/741,187

(22) Filed: Dec. 19, 2003

(65) Prior Publication Data

US 2004/0132418 A1    Jul. 8, 2004

(30) Foreign Application Priority Data

Dec. 20, 2002    (EP)    ................................. 02028645

(51) Int. Cl.
*H04B 1/16*    (2006.01)

(52) U.S. Cl. ...................... 455/229; 455/143; 375/358; 375/359

(58) Field of Classification Search ................. 455/142, 455/143, 144, 146, 147, 229; 375/358, 359, 375/362, 261, 326, 343, 35
See application file for complete search history.

(56) References Cited

U.S. PATENT DOCUMENTS

| 5,777,511 | A  | * | 7/1998  | Masumoto et al. | ........... 329/304 |
|-----------|----|---|---------|-----------------|---------------------|
| 6,556,631 | B1 | * | 4/2003  | Yamamoto et al. | ........... 375/340 |
| 6,661,292 | B2 | * | 12/2003 | Gierl et al.    | ................... 331/1 A |
| 6,775,324 | B1 | * | 8/2004  | Mohan et al.    | ................ 375/238 |
| 6,920,086 | B1 | * | 7/2005  | Sommer et al.   | ................. 369/6 |
| 2001/0043584 | A1 | * | 11/2001 | Kersken et al. | ............. 370/349 |
| 2002/0126771 | A1 | * | 9/2002  | Li et al.      | ....................... 375/324 |
| 2002/0140515 | A1 | * | 10/2002 | Gierl et al.   | ................... 331/100 |
| 2002/0168030 | A1 | * | 11/2002 | Wildhagen      | .................. 375/316 |
| 2003/0186661 | A1 | * | 10/2003 | Fricke et al.  | ............. 455/150.1 |
| 2003/0205460 | A1 | * | 11/2003 | Buda           | ..................... 204/192.13 |

FOREIGN PATENT DOCUMENTS

| EP | 0 471 412 | 2/1992 |
| JP | 2-132922  | 5/1990 |

* cited by examiner

*Primary Examiner*—Edward Urban
*Assistant Examiner*—Christian A Hannon
(74) *Attorney, Agent, or Firm*—Oblon, Spivak, McClelland, Maier & Neustadt, L.L.P.

(57) ABSTRACT

A signal receiver and a method for separating a RDS signal component from a received signal is described. After the received signal has been downconverted to the baseband, the baseband signal is split up into a first baseband signal for a first signal path and a second baseband signal for a second signal path. The first baseband signal is highpass filtered and forwarded to a frequency synchronization unit that generates a frequency synchronization carrier. The second baseband signal is modified in accordance with the frequency synchronization carrier provided by the first signal path, and a synchronized baseband signal is obtained that still comprises the full range of the RDS signal's spectral components.

24 Claims, 5 Drawing Sheets

Figure 1: Prior Art

METHOD FOR SEPARATING A RDS SIGNAL COMPONENT AND SIGNAL RECEIVER

The present invention is related to a signal receiver adapted for receiving a signal comprising a RDS signal component, and to a method for separating a RDS signal component from a received signal.

Many FM radio stations transmit information about the actual traffic situation to their listeners. Some drivers are interested In listening to the actual road messages for their area, but they do not want to listen continuously to a certain radio station. For these drivers, the standard ARI (Autofahrer Rundfunk Informationssystem) has been developed. By modulating a carrier with low frequencies of e.g. 125 Hz, it is possible to indicate to the FM receivers that a road message is broadcast. Another low-frequency component might be used for signalling the respective area for which the respective road message is intended.

Instead of ARI, which has been defined quite a while ago, the standard RDS (Radio Data System) becomes more and more important for transmitting additional information relating to a FM station's program. Often, both standards are used simultaneously, whereby both the RDS signal and the ARI signal are modulated to a common carrier signal. As a carrier, the third harmonic of the pilot carrier is used, whereby the RDS signal is modulated to the inphase component of this 57 kHz signal, and whereby the ARI information is modulated to the quadrature component of said carrier. A FM receiver has to be capable of demodulating said carrier signal, in order to obtain the underlying RDS data.

It is an object of the present invention to provide a signal receiver and a method for separating a RDS signal component from a received signal, whereby the quality of the decoded RDS signal is improved.

The object of the present invention is solved by a signal receiver according to claim 1, and by a method for separating a RDS signal component from a received signal according to claim 13. Preferred embodiments thereof are respectively defined in the dependent sub-claims. Computer program products according to the present invention are defined in claims 23 and 24.

According to the invention, a signal receiver is provided that is adapted for receiving a signal comprising a RDS signal component. The signal receiver comprises a downconversion unit for converting the received signal to a baseband signal. Furthermore, the signal receiver comprises a first signal path and a second signal path for said baseband signal. The first signal path comprises a first highpass filter unit that filters said baseband signal and generates a highpass filtered signal, and a frequency synchronization unit that derives, from the highpass filtered signal, a frequency synchronization carrier signal. In said second signal path, the baseband signal's frequency is modified in accordance with said frequency synchronization carrier signal to obtain a synchronized baseband signal.

After the received signal has been converted to the baseband, the baseband signal is split up into a first signal path and a second signal path. The first signal path is responsible for providing a frequency synchronization carrier signal that is required for performing a frequency synchronization of the baseband signal. For generating the frequency synchronization carrier signal, the low-frequency components of the baseband signal, and in particular the ARI signal, have to be suppressed. This task is fulfilled by the first highpass filter unit. The highpass filtered signal is provided to a frequency synchronization unit, and starting from said highpass filtered signal, the frequency synchronization carrier signal can be determined.

The frequency synchronization itself is performed within the second signal path. The baseband signal of the second signal path is synchronized in accordance with said frequency synchronization carrier signal, which is provided by the first signal path, and a synchronized baseband signal is obtained. The baseband signal of the second signal path is subjected to a filtering operation that suppresses only few of the low-frequency part of the baseband signal's spectrum—i.e. the high pass filter cut-off frequency is lower—and therefore, within the synchronized baseband signal, almost the full range of spectral components is preserved. The low-frequency part of the RDS signal's spectrum is not lost.

Preserving most of the low-frequency components of the baseband signal implies that the synchronized baseband signal still comprises parts of the ARI signal. This is not a problem, though, because the RDS signal has been modulated to the inphase component, whereby the ARI signal has been modulated to the quadrature component. As soon as the frequency synchronization of the baseband signal has been performed, it is possible to separate the inphase component from the quadrature component of the synchronized baseband signal. By determining the real part of the synchronized baseband signal, the inphase component is obtained, and by determining the imaginary part of the synchronized baseband signal, the quadrature component is obtained. The inphase component does not contain any ARI signal components. Therefore, the invention permits to obtain the RDS signal without any distortions, whereby the full range of spectral components of the RDS signal is preserved. This leads to a higher signal quality of the decoded RDS signal. Another advantage is that the total signal power of the synchronized baseband signal is increased, because the low-frequency components of the baseband signal are not lost. At the same time, the first high pass filter suppresses the ARI signal completely, so that the frequency synchronization loop is not influenced by the ARI signals.

Preferably, the cut-off frequency of said first highpass filter is adapted for suppressing low-frequency components of an ARI signal component of said baseband signal. From the highpass filtered signal, the frequency synchronization carrier signal is derived. In case the input signal of the frequency synchronization unit comprises strong contributions of low frequency ARI components, the frequency synchronization carrier signal cannot be determined correctly. For this reason, it is advantageous to provide the frequency synchronization unit with an input signal in which said low frequency components have been suppressed. This can be achieved by designing the first highpass filter of the first signal path in a way that the cut-off frequency of said highpass filter is larger than the frequency of the ARI signal.

Preferably, said received signal is multiplied with an internal carrier frequency in said downconversion unit. The received signal is centred around its carrier frequency. In order to simplify further signal processing in a digital implementation, it is advantageous to convert the received signal into a baseband signal. This can be done by generating the known carrier frequency (57 kHz) on part of the receiver. Then, the received signal is multiplied with this internal carrier frequency.

According to a preferred embodiment of the invention, the signal receiver comprises a matched filter for suppressing out-of-band frequency components of said baseband signal. Said matched filter might e.g. be a lowpass filter, whereby the filter's cut-off frequency is defined according to the frequency range of said baseband signal. By suppressing out-of-band frequency components, the signal to noise ratio of the baseband signal is improved.

Preferably, said frequency synchronization unit is implemented as a frequency synchronization loop, and preferably as a COSTAS loop. In a frequency synchronization loop, a frequency synchronization between the received signal's carrier and the internal carrier is achieved. As soon as the received signal's carrier and the internal carrier are synchronized, the received signal can be demodulated, and the inphase component and the quadrature component of the received signal can be distinguished.

Preferably, said second signal path comprises a mixing unit for multiplying said baseband signal with said frequency synchronization carrier signal to obtain said synchronized baseband signal. Starting from the highpass filtered signal of the first signal path, the frequency synchronization unit generates the frequency synchronization carrier signal. When the baseband signal of the second signal path is multiplied with said frequency synchronization carrier signal, the frequency and phase of said baseband signal is shifted in a way that the difference between the received signal's carrier frequency and the internal carrier frequency is exactly compensated. A synchronized baseband signal is obtained, which serves as a starting point for determining the inphase component and the quadrature component.

According to a preferred embodiment of the invention, said second signal path comprises a second highpass filter unit, whereby the cut-off frequency of said second highpass filter unit is adapted for suppressing a DC component of said baseband signal. In order to preserve the low-frequency components of the RDS signal, the cut-off frequency of the second highpass filter is much smaller than the cut-off frequency of the first highpass filter. The task of the second highpass filter is to remove the DC component caused by the received signal's carrier frequency.

According to an alternative embodiment of the invention, said second signal path comprises a delay unit for delaying said baseband signal before said frequency synchronization is performed. The baseband signal of the first signal path is delayed both by the first highpass filter. In order to compensate this delay, the baseband signal of the second signal path is delayed by the same amount.

According to another preferred embodiment of the invention, the signal receiver comprises an extraction unit and in particular a real part extraction unit that separates the inphase signal component from the synchronized baseband signal. As soon as the frequency synchronization has been performed, the inphase signal component can be obtained by determining the real part of the complex baseband signal. Because the ARI information has been modulated to the quadrature component, the inphase component does not contain any ARI signal any more. Thus, by extracting the real part of the synchronized baseband signal, it is possible to completely eliminate the low-frequency ARI component without performing any highpass filtering operations in the second signal path.

Preferably, the signal receiver comprises a time synchronization unit for sampling a signal component of said synchronized baseband signal, and for providing a digitised signal component. Further preferably, said time synchronization unit is implemented as a time synchronization loop that optimises the timing of the sample pulses according. The time synchronization unit is responsible for digitising the synchronized baseband signal. The timing of the sample pulses is essential for obtaining the correct sequence of digits. A time synchronization loop constantly monitors whether the sample pulses occur too early or too late and corrects the timing of the sample pulses accordingly.

According to a preferred embodiment of the invention, the signal receiver comprises a data decoder for decoding a digitised signal component to obtain a RDS signal.

The invention may also be described by the following remarks:

The invention is related to a frequency synchronisation of a RDS decoder for FM broadcast.

The RDS signal is a biphase coded signal. In FM broadcast, the RDS signal is modulated to the $3^{rd}$ harmonic of the pilot carrier. The $3^{rd}$ harmonic of the pilot carrier contains the ARI information and the RDS information. One signal is modulated to the inphase and the other component is modulated to the quadrature component of the 57 kHz carrier. In a FM receiver, the receiver needs to synchronize to the RDS signal. The frequency synchronisation is usually done using a COSTAS loop and the time synchronisation is done using a time synchronisation loop.

The RDS signal is downconverted to a complex baseband signal. The complex baseband signal is filtered with a matched filter to eliminate out of band distortions. The signal is then filtered with a highpass filter to remove the ARI information from the complex RDS baseband signal. The highpass filtered RDS signal is then input to a COSTAS loop for the frequency synchronisation. The real, frequency synchronised signal is then input to the time synchronisation loop. The time synchronisation loop outputs the data that is decoded in the data decoder.

For the frequency synchronisation to the RDS signal, the ARI signal needs to be suppressed using the highpass filter. It is obvious that a reduction of signal energy by removing the ARI carriers disturbs the RDS signal. Depending on the highpass filter, the RDS signal is disturbed by removing spectral components from the RDS signal.

Distortions in the RDS signal lead to a reduction of the sensitivity of the RDS decoder. The invention avoids the distortion of the RDS signal and reduces therefore the bit array rate of the RDS decoder.

The RDS signal and the ARI signal are modulated in quadrature. The frequency synchronisation loop requires an input signal with removed ARI carrier. Therefore, the input signal to the COSTAS loop is filtered with a highpass filter according to the state of the art solution. The COSTAS loop synchronises to the highpass filtered RDS signal and outputs the carrier for the frequency synchronisation. The baseband RDS signal is filtered in a second path with a $2^{nd}$ highpass filter that has a different characteristic from the $1^{st}$ highpass filter. The $2^{nd}$ highpass filter mainly removes the DC component of the RDS baseband signal. Since the ARI signal and the RDS signal are modulated in quadrature, the frequency synchronisation of the $2^{nd}$ path outputs the RDS signal without ARI information.

The highpass filter 2 has a different characteristic from highpass filter 1. Highpass filter 2 mainly removes the DC component from the RDS signal, so the signal power of the RDS signal is not reduced. As a result, the sensitivity of the RDS decoder is improved compared to the state of the art solution.

In an alternative digital solution the calculation power requirements can be reduced by replacing the highpass filter 2 with a delay element and by performing the highpass 2 filtering after the real part extraction.

The invention increases the sensitivity of the RDS decoder.

In the following, the invention will be described in more detail taking reference to the accompanying figures on the basis of preferred embodiments of the invention.

Figure 1:
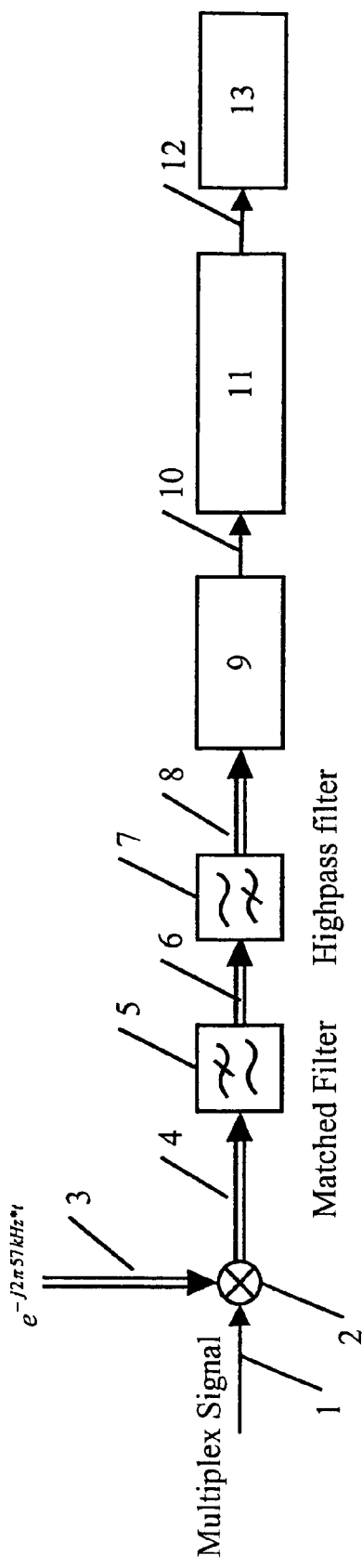
FIG. 1 shows a FM receiver according to the prior art which is adapted for receiving a RDS signal.

In FIG. 1, a prior art solution for a receiver of a RDS signal is shown. A multiplex signal 1 is received, whereby the RDS data is modulated to the inphase component of the carrier signal. Within the same carrier signal, the ARI signal is transmitted. The ARI information is modulated to the quadrature component of the carrier signal. Usually, the ARI signal comprises two low frequency components around 23.75 Hz to 53.9773 Hz and at 125 Hz. When a radio message concerning the traffic situation is transmitted, the 125 Hz component is activated. The component around 23.75 Hz to 53.9773 Hz is used for transmitting regional information about the area for which said radio message is relevant.

In a first step, the multiplex signal 1 is downconverted to the baseband. For this purpose, the multiplex signal 1 is multiplied, in the mixer 2, with an internal carrier frequency 3. In FM broadcast, the third harmonic of the pilot carrier, which corresponds to a frequency of 57 kHz, is used as a carrier frequency. As a result of the downconversion, a complex baseband signal 4 is obtained. The complex baseband signal 4 is filtered with a matched filter 5 to eliminate out-of-band distortions. By doing this, the signal quality is improved. The filtered baseband signal 6 is then forwarded to a highpass filter 7, and there, the low frequency components of the ARI information are removed. For this purpose, the cut-off frequency of the highpass filter 7 is set to a frequency above the frequencies of the ARI signal components, for example to a value above 125 Hz. The highpass filtered signal 8 is then provided to a frequency synchronization loop 9, which is preferably realised as a COSTAS loop. In the frequency synchronization loop 9, any offset between the carrier frequency of the received multiplex signal 1 and the internal carrier frequency 3 is compensated by shifting the baseband signal according to said frequency offset. At the output of the frequency synchronization loop 9, a frequency synchronized signal 10 is obtained. This signal, which is a complex baseband signal, is forwarded to the time synchronization unit 11, and there, said signal is converted into a digital signal. The frequency synchronized signal 10 is sampled in regular time intervals. The time synchronization unit 11 comprises a time synchronization loop for continuously monitoring whether the sample pulses are too early or too late, and for adjusting the timing of said sample pulses. At the output of the time synchronization unit 11, a digitised signal 12 is obtained, and said signal is provided to the data decoder 13. There, the digitised signal 12 is decoded, and the RDS signal that has been modulated to the 57 kHz carrier is recovered.

Figure 2:
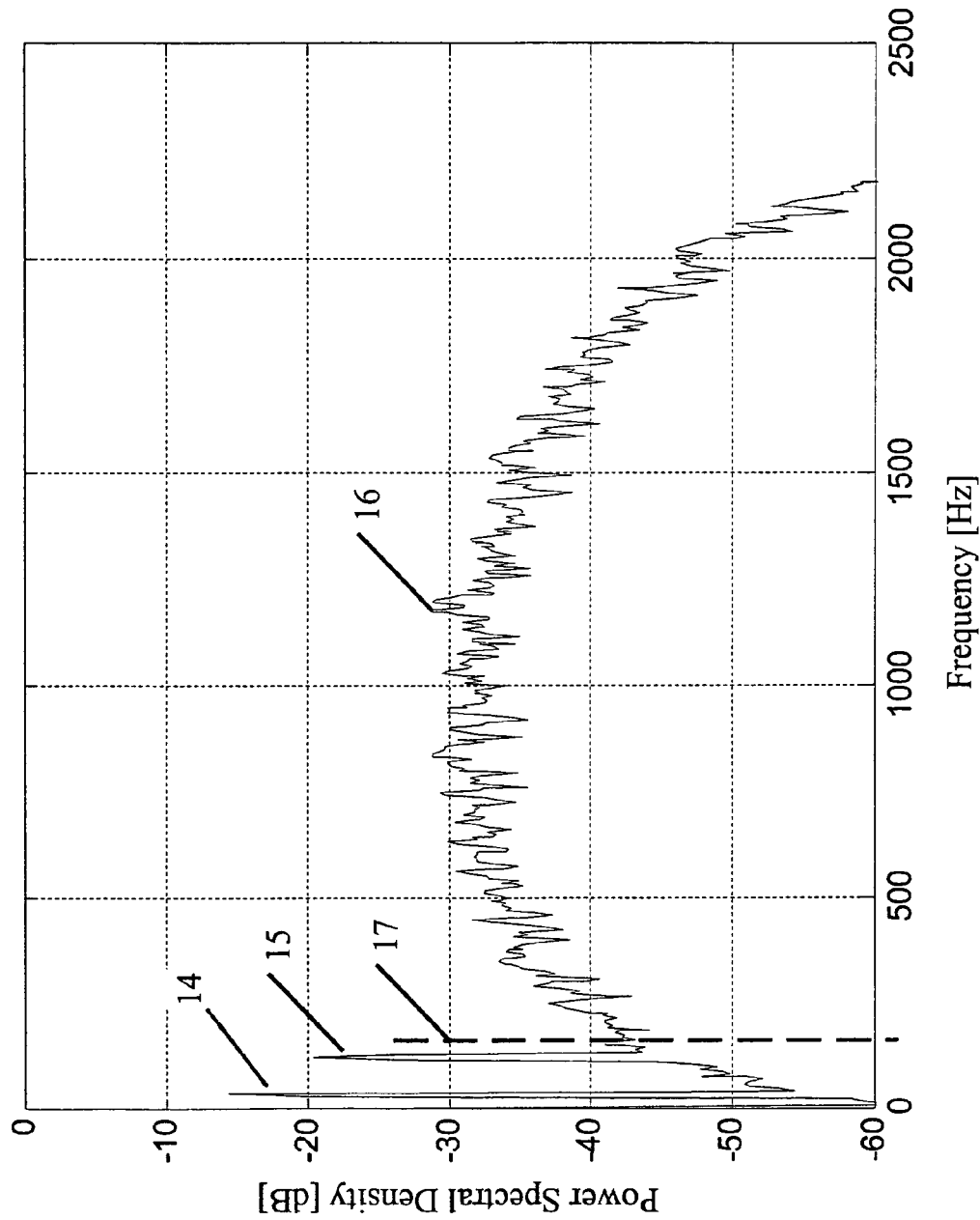
FIG. 2 shows the power spectrum of a complex baseband signal comprising both a RDS spectrum and ARI signal components.

In FIG. 2, the power spectrum magnitude of the complex baseband signal is depicted as a function of frequency. The spectrum comprises a first ARI signal component 14, for example at 34 Hz, and a second ARI signal peak 15, for example, at 125 Hz. Besides these ARI signal peaks, the spectrum comprises spectral components 16 of the RDS signal that extend from 0 kHz to approximately 2.2 kHz. The cut-off frequency 17 of the highpass filter 7 is also shown in FIG. 2. The highpass filter 7 suppresses the ARI signal components 14, 15, because these low frequency components would disturb the frequency synchronization. Therefore, only the part of the spectrum above the cut-off frequency is provided to the frequency synchronization unit 9.

In the prior art solution shown in FIG. 1, the highpass filter 7 does not only suppress the ARI signal components, but also the low-frequency components of the RDS spectrum. Because of the missing low-frequency components of the RDS spectrum, a distorted RDS signal is obtained. Besides that, the suppression of the baseband signal's low frequencies leads to a reduction of the total signal power.

Figure 3:
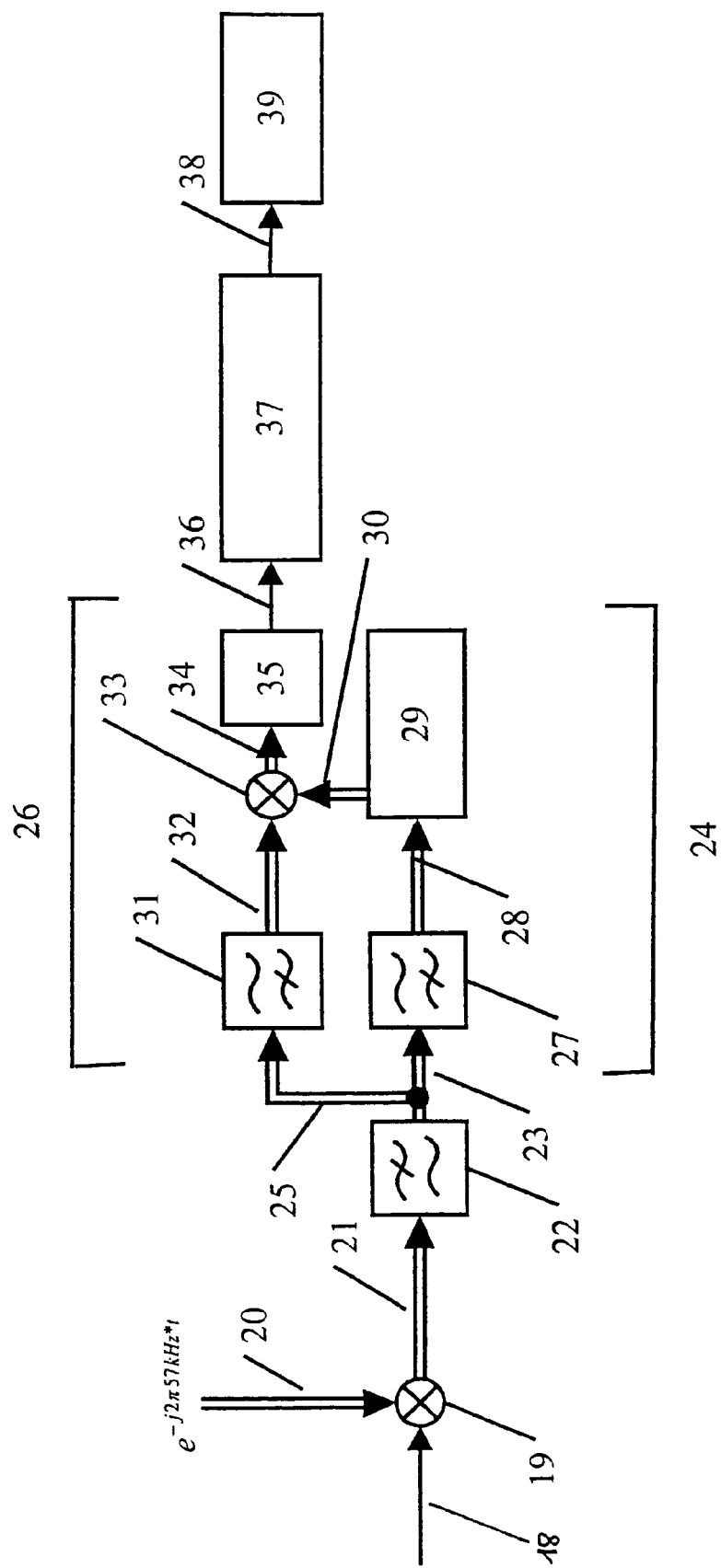
FIG. 3 shows a first embodiment of the present invention.

In FIG. 3, a receiver for a RDS signal according to a first embodiment of the invention is shown. A multiplex signal 18 with a carrier frequency of 57 kHz is received, whereby the RDS signal has been modulated to the inphase component of said carrier, and whereby the ARI signal has been modulated to the quadrature component of said carrier. The mixer 19 multiplies the multiplex signal 18 with an internal carrier frequency 20 and downconverts the multiplex signal 18 to the baseband. A downconverted baseband signal 21 is obtained. The matched filter 22 filters the baseband signal 21, whereby all frequency components outside the desired frequency range of the baseband signal are removed. The baseband signal at the output of the matched-filter 22 is split up into a first baseband signal 23 for a first signal path 24, and into a second baseband signal 25 for a second signal path 26. The first signal path 24 comprises a first highpass filter 27. The cut-off frequency of the highpass filter 27 is defined such that the low frequency components of the ARI signal, and in particular the ARI signal components 14 and 15 shown in FIG. 2, are suppressed. The highpass filtered signal 28 is forwarded to a frequency synchronization loop 29, which is preferably realised as a COSTAS loop. The frequency synchronization loop 29 generates a frequency synchronization carrier 30, whereby the frequency of said frequency synchronization carrier 30 corresponds to the frequency difference between the received signal's carrier frequency and the internal carrier frequency 20. Therefore, the frequency synchronization carrier 30 is suitable for compensating this frequency offset, and for synchronizing the baseband signal.

The second signal path 26 comprises a second highpass filter 31, whereby the cut-off frequency of the second highpass filter 31 is significantly lower than the cut-off frequency of the first highpass filter 27. The main purpose of the second highpass filter 31 is to suppress any DC component of the second baseband signal 25. Because of the low cut-off frequency, the second highpass filter 31 does not significantly affect the low-frequency components of the ARI signal or the low-frequency components of the RDS spectrum. The modified baseband signal 32 obtained at the output of the second highpass filter 31 is provided, as a first input, to the mixer 33. The frequency synchronization carrier 30 generated by the frequency synchronization loop 29 is provided, as a second input, to the mixer 33. The mixer 33 shifts the frequency of the modified baseband signal 32 in accordance with that frequency synchronization carrier 30 and generates a synchronized baseband signal 34.

In the real part extraction unit 35, the real part of the complex synchronized baseband signal 34 is determined, and thus, the inphase component 36 is obtained. When assuming that the RDS signal has been modulated to the inphase component and that the ARI signal has been modulated to the quadrature component, it becomes clear that the set-up of FIG. 3 allows to separate the RDS signal from the ARI signal. The inphase component 36 does not contain any ARI signal components anymore, and in particular, the ARI signal components 14, 15 depicted in FIG. 2 do not show up in the inphase component 36 anymore. The inphase component 36 only comprises the RDS spectrum 16 shown in FIG. 2. Because of the low cut-off frequency of the second highpass filter 31, the inphase component 36 also comprises the low frequency components of the RDS spectrum 16. It has to be pointed out that the described method for suppressing ARI signal components by separating the inphase component from the quadrature component, whereby the inphase component contains the RDS signal, and whereby the quadrature component contains the ARI signal, is only applicable as soon as the frequency synchronization has been performed.

The inphase component 36 is forwarded to the time synchronization unit 37, and there, the inphase component 36 is digitised. The time synchronization unit 37 comprises a time synchronization loop for optimising the points of time at which the inphase component 36 is sampled. The digital inphase signal 38 obtained at the output of the time synchronization unit 37 is decoded by a data decoder 39. From the digital inphase signal 38, the underlying RDS signal is derived.

Figure 4:
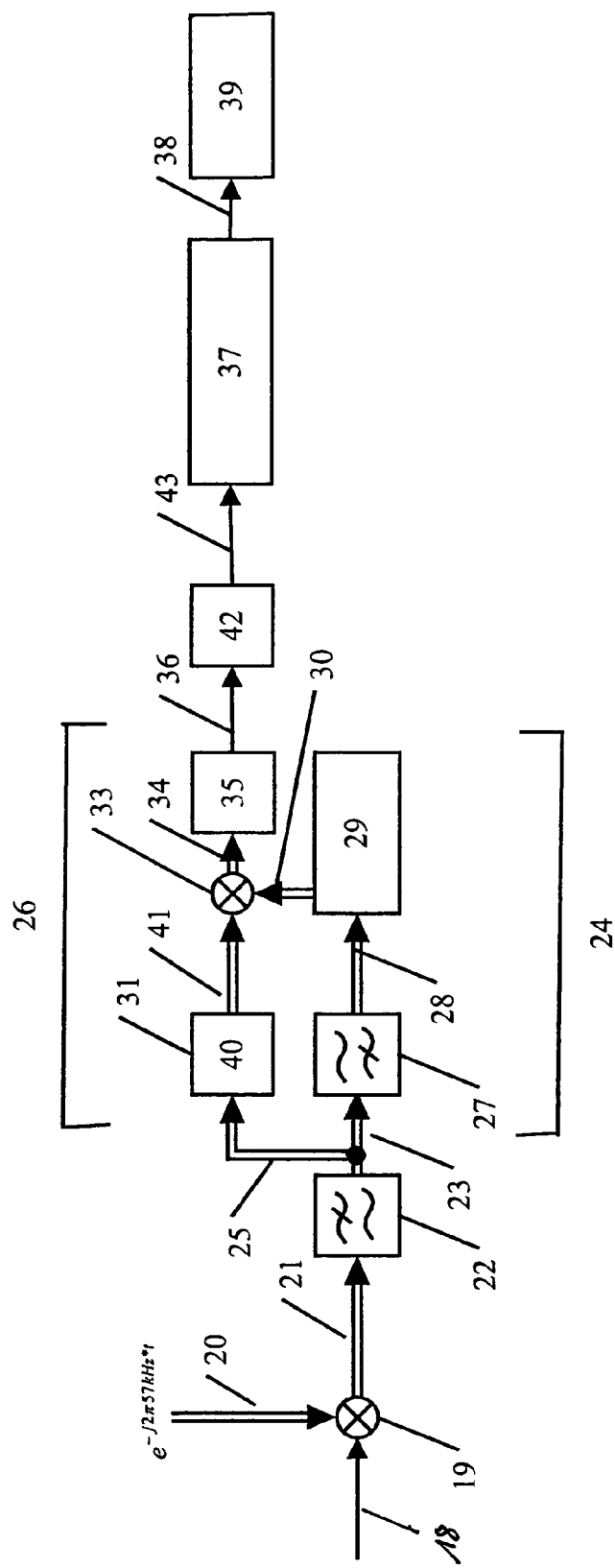
FIG. 4 shows a second embodiment of the present invention.

Though it is advantageous to remove the second baseband signal's DC component by including a second highpass filter 31 in the second signal path 26, said second highpass filter 31 is not necessarily required. In FIG. 4, a second embodiment of the invention is shown, whereby features that are substantially or functionally equal or similar to the features shown in FIG. 3 will be referred to with the same reference signs. In the second embodiment of the invention, the second signal path comprises a delay element 40 that compensates the delay caused by the first highpass filter 27. The delayed signal 41 obtained at the output of the delay element 40 is forwarded, as a first input, to the mixer 33. The frequency synchronization carrier 30 is provided, as a second input, to the mixer 33. At the output of the mixer 33, the synchronized baseband signal 34 is obtained, and in the real part extraction unit 35, the inphase component 36 of said signal is determined. The inphase component 36 is provided to a highpass filter 42 that eliminates any DC component of the inphase signal 36. By performing the highpass filtering after the real part extraction, the calculation power requirements can be reduced, because only the real part of the complex signal is subjected to the filtering. The highpass filtered signal 43 is provided to the time synchronization unit 37, and there, the highpass filtered signal 37 is digitised. The digital inphase signal 38 is decoded by the data decoder 39, and the RDS signal is obtained.

Figure 5A:
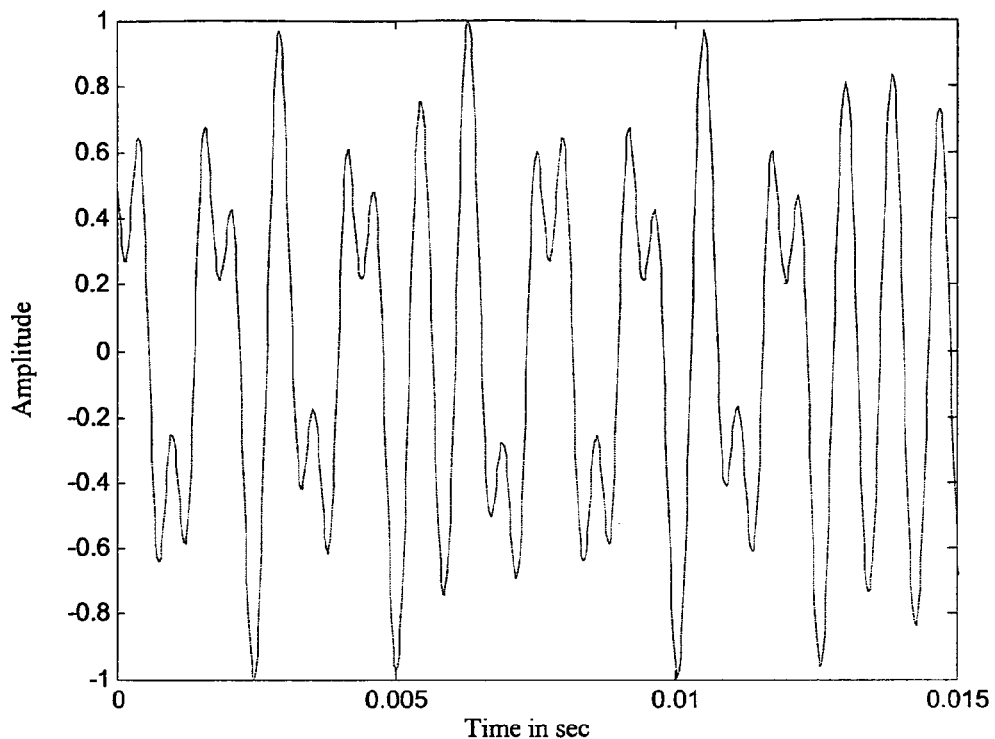
FIG. 5A depicts a decoded RDS signal derived from a highpass filtered baseband signal, whereby the low frequency components of said baseband signal have been suppressed.

In FIG. 5A, an RDS signal obtained with the set-up shown in FIG. 1 is shown. The highpass filtering operation performed by the highpass filter 7 causes distortions of the RDS signal. Besides that, the suppression of the low-frequency components of the RDS spectrum lowers the total power of the baseband signal.

Figure 5B:
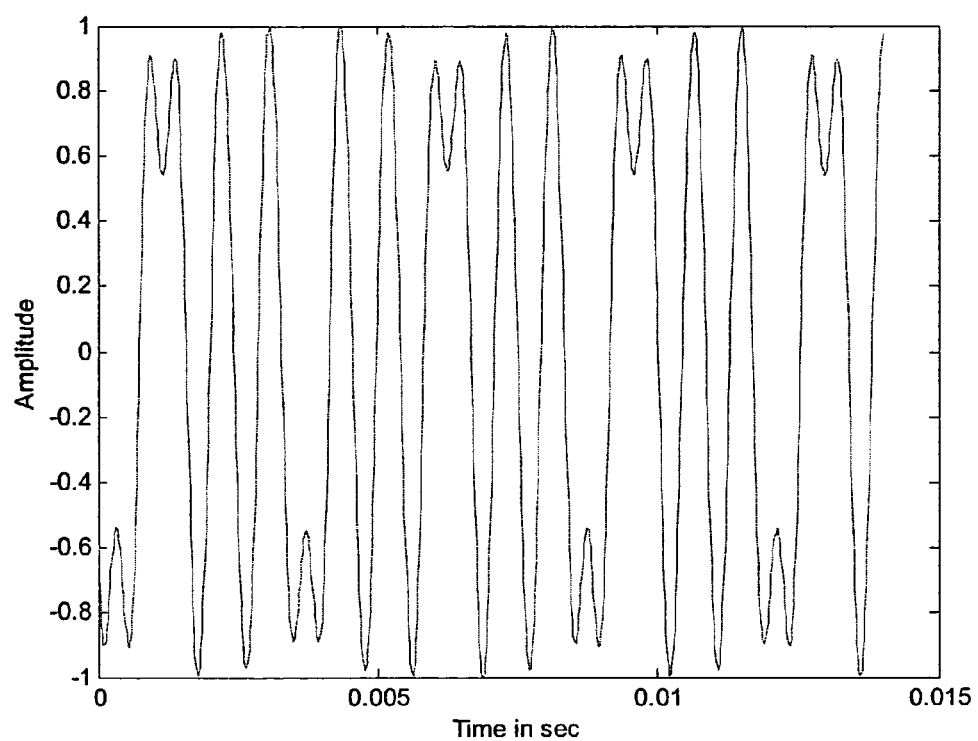
FIG. 5B shows a decoded RDS signal as obtained with an FM receiver shown in FIG. 3 or FIG. 4.

FIG. 5B shows a decoded RDS signal as obtained with the first or the second embodiment of the present invention. According to the invention, it is possible to remove the ARI signal peaks without suppressing the low frequency part of the RDS spectrum, and therefore, the decoded RDS signal shown in FIG. 5B is less distorted than the RDS signal shown in FIG. 5A. The cut-off frequency of the highpass filter 31 or 42 is much lower than the cut-off frequency of the highpass filter 7, and for this reason, the signal energy of the baseband signal is higher than in the prior art solution. These two effects lead to an increase of the RDS decoder's sensitivity, and therefore, the signal quality of the RDS signal—which is signal 21 of FIG. 1, i.e. a complex signal comprising RDS and ARI—shown in FIG. 5B is improved.

In general, an inphase component consists of a 57 kHz carrier and the ARI signal.

The quadrature component consists of the RDS signal only. Therefore, the second path's high pass filter suppresses remaining (cross-talking) components from the inphase component. They exist due to non-optimal optimisation of the COSTAS loop.

List of Reference Symbols 1 multiplex signal
2 mixer
3 internal carrier, internal carrier frequency
4 complex baseband signal
5 filter, matched filter
6 filtered baseband signal
7 highpass filter
8 highpass filtered signal
9 frequency synchronization loop
10 frequency synchronized signal
11 synchronization unit
12 digitized signal
13 data decoder
14 first ARI signal component
15 second ARI signal component
16 spectral component(s) of RDS signal
17 cut-off frequency
18 received signal, multiplex signal
19 mixer, downconversion unit
20 internal carrier, internal carrier frequency
21 baseband signal, complex baseband signal
22 filter, matched filter
23 first baseband signal
24 first signal path
25 second baseband signal
26 second signal path
27 highpass filter, highpass filter unit
28 highpass filtered signal
29 frequency synchronization loop
30 carrier signal, frequency synchronized carrier
31 second highpass filter
32 modified baseband signal
33 mixer
34 synchronized baseband signal
35 real part extraction unit
36 inphase component
37 time synchronization unit
38 digital inphase signal
39 data decoder
40 delay element
41 delayed signal
42 highpass filter
43 highpass filtered signal

The invention claimed is:

1. A signal receiver for receiving a signal including a RDS signal component, comprising:
a single downconversion unit configured to convert a received signal to a baseband signal;
a first signal path for said baseband signal, said first signal path being located downstream said downconversion unit and including a first highpass filter unit configured to filter said baseband signal and to generate a highpass filtered signal, and a frequency synchronization unit configured to derive, from said highpass filtered signal, a frequency synchronization carrier signal;
a second signal path for said baseband signal located downstream said downconversion unit, whereby in said second signal path, the baseband signal's frequency is modified in accordance with said frequency synchronization carrier signal to obtain a synchronized baseband signal; and a splitting unit located downstream said downconversion unit and located upstream said first and second signal paths and configured to directly receive the baseband signal from the downconversion unit and to directly split the baseband signal into the first highpass filter unit, of the first signal path, and the second signal path.

2. The signal receiver according to claim 1, wherein a cut-off frequency of said first highpass filter is adapted for suppressing low-frequency components of an ARI signal component of said baseband signal.

3. The signal receiver according to claim 1, wherein said downconversion unit is configured to multiply said received signal with an internal carrier frequency.

4. The signal receiver according to claim 1, further comprising:

a matched filter configured to suppress out-of-band frequency components of said baseband signal.

5. The signal receiver according to claim 1, wherein said frequency synchronization unit is implemented as a frequency synchronization loop, and preferably as a COSTAS loop.

6. The signal receiver according to claim 1, wherein said second signal path includes a mixing unit configured to multiply said baseband signal with said frequency synchronization carrier signal to obtain said synchronized baseband signal.

7. The signal receiver according to claim 1, wherein said second signal path includes a second highpass filter unit, whereby a cut-off frequency of said second highpass filter unit is adapted for suppressing at least a DC component of said baseband signal.

8. The signal receiver according to claim 1, wherein said second signal path includes a delay unit configured to delay said baseband signal before the baseband signal's frequency is modified in accordance with said frequency synchronization carrier signal.

9. The signal receiver according to claim 1, further comprising:

an extraction unit configured to separate an inphase signal component from the synchronized baseband signal.

10. The signal receiver according to claim 1, further comprising:

a time synchronization unit configured to sample a signal component of said synchronized baseband signal, and to provide a digitized signal component.

11. The signal receiver according to claim 10, wherein said time synchronization unit is implemented as a time synchronization loop that optimizes a timing of the sample pulses.

12. The signal receiver according to claim 1, further comprising:

a data decoder configured to decode a digitized signal component to obtain a RDS signal.

13. A method for separating a RDS signal component from a received signal including a RDS signal component, comprising:

converting, by a single down conversion unit, said received signal into a baseband signal;

directly splitting up, by a splitting unit, said baseband signal converted in the converting step into a first baseband signal for a first highpass filtering operation, of a first signal path, and a second baseband signal for a second signal path;

performing the first highpass filtering operation of said first baseband signal in order to generate a highpass filtered signal, whereby low-frequency components of said first baseband signal are removed;

deriving, from said highpass filtered signal, a frequency synchronization carrier signal; and modifying said second baseband signal's frequency in accordance with said frequency synchronization carrier signal to obtain a synchronized baseband signal.

14. The method according to claim 13, wherein the step of performing a first highpass filtering operation comprises performing the first highpass filtering operation with a cut-off frequency that is adapted for suppressing low frequency components of an ARI signal component of said first baseband signal.

15. The method according to claim 13, further comprising:
multiplying said received signal with an internal carrier frequency in order to generate said baseband signal.

16. The method according to claim 13, further comprising:
suppressing out-of-band frequency components of said baseband signal.

17. The method according to claim 13, further comprising:
multiplying said second baseband signal with said frequency synchronization carrier signal to obtain said synchronized baseband signal.

18. The method according to claim 13, further comprising:
performing a second highpass filtering operation of said second baseband signal for suppressing at least a DC component of said second baseband signal.

19. The method according to claim 13, further comprising:
delaying said second baseband signal of said second signal path before modifying said second baseband signal's frequency in accordance with said frequency synchronization carrier signal.

20. The method according to claim 13, further comprising:
separating an inphase signal component from the synchronized baseband signal by extracting a real or imaginary part of said synchronized baseband signal.

21. The method according to claim 13, further comprising:
sampling a signal component of said synchronized baseband signal, and providing a digitized signal component.

22. The method according to claim 13, further comprising:
decoding a digitized signal component to obtain a RDS signal.

23. A computer program product, comprising computer program means adapted to embody the features of the signal receiver as defined in claim 1 when said computer program product is executed on a computer or digital signal processor.

24. A computer program product, comprising computer program means adapted to perform the method steps as defined in claim 13 when said computer program product is executed on a computer or digital signal processor.

* * * * *